(12) United States Patent
Hishiya et al.

(10) Patent No.: US 7,064,084 B2
(45) Date of Patent: Jun. 20, 2006

(54) OXIDE FILM FORMING METHOD

(75) Inventors: Shingo Hishiya, Nirasaki (JP); Koji Akiyama, Nirasaki (JP); Yoshikazu Furusawa, Nirasaki (JP); Kimiya Aoki, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/468,914

(22) PCT Filed: Feb. 28, 2002

(86) PCT No.: PCT/JP02/01869

§ 371 (c)(1),
(2), (4) Date: Aug. 25, 2003

(87) PCT Pub. No.: WO02/075802

PCT Pub. Date: Sep. 26, 2002

(65) Prior Publication Data

US 2004/0087180 A1    May 6, 2004

(30) Foreign Application Priority Data

Feb. 28, 2001    (JP) .............................. 2001-055281

(51) Int. Cl.
*H01L 21/324* (2006.01)

(52) U.S. Cl. ...................... 438/770; 438/761; 438/778; 438/783; 438/909

(58) Field of Classification Search ................ 438/125, 438/216, 585, 591, 660, 761, 770, 773, 778, 438/783, 787, 788, 909, FOR. 395, FOR. 398, 438/FOR. 403
See application file for complete search history.

(56) References Cited

U.S. PATENT DOCUMENTS 5,330,935 A    7/1994 Dobuzinsky et al.

(Continued)

FOREIGN PATENT DOCUMENTS

JP    59-227128    12/1984

(Continued)

OTHER PUBLICATIONS

Wolf et al, "Silicon Processing for the VLSI Era: Process Technology", Aug. 1986, Lattice Press, vol. 1, pp. 215-216.*

(Continued)

*Primary Examiner*—Matthew Smith
*Assistant Examiner*—Joannie Garcia
(74) *Attorney, Agent, or Firm*—Smith, Gambrell & Russell, LLP

(57) ABSTRACT

To provide a method for the formation of oxide films to form with advantage a high-quality oxide film having excellent uniformity in film thickness and film quality over the entire wafer. The method for the formation of oxide films comprises: the pretreatment process of forming a protective oxide film on the surface of a wafer positioned in a reaction vessel by performing oxidation treatment with radical oxidative species or an atmosphere containing radical oxidative species under depressurized conditions; and the oxide-film-formation process of forming an oxide film on the wafer by performing oxidation treatment at a predetermined temperature under depressurized conditions. The oxide-film-formation process is preferably performed following the pretreatment process in a continuous manner in the reaction vessel in which the pretreatment process is performed. The pretreatment process is preferably performed at a temperature lower than the temperature for the oxide-film-formation process and also preferably performed under depressurized conditions, the level of the depressurization being higher than the level for the oxide-film-formation process. A high-quality gate-insulating film for a transistor chip can be formed according to this method for the formation of oxide films.

6 Claims, 5 Drawing Sheets

U.S. PATENT DOCUMENTS

| | | | |
|---|---|---|---|
| 5,693,578 A | 12/1997 | Nakanishi et al. | |
| 6,511,921 B1* | 1/2003 | Panczyk et al. | 438/770 |
| 6,599,847 B1* | 7/2003 | Jang et al. | 438/787 |
| 6,607,946 B1* | 8/2003 | Sandhu et al. | 438/142 |
| 6,706,572 B1* | 3/2004 | Yamazaki et al. | 438/166 |
| 2001/0021595 A1* | 9/2001 | Jang | 438/787 |
| 2002/0127883 A1* | 9/2002 | Conti et al. | 438/787 |

FOREIGN PATENT DOCUMENTS

| | | |
|---|---|---|
| JP | 01-280320 | 11/1989 |
| JP | 05-055197 | 3/1993 |
| JP | 06-333917 | 12/1994 |
| JP | 09-153489 | 6/1997 |
| JP | 10-178009 | 6/1998 |

OTHER PUBLICATIONS

International Preliminary Examination Report (PCT/IPEA/409) (translated) issued for PCT/JP2002/001869.

Notification of Transmittal of Copies of Translation of the International Preliminary Examination Report (PCT/IB/338) issued for PCT/JP2002/001869.

Supplementary European Search Report issued in connection with EP 02 70 1646, dated Nov. 11, 2005.

* cited by examiner

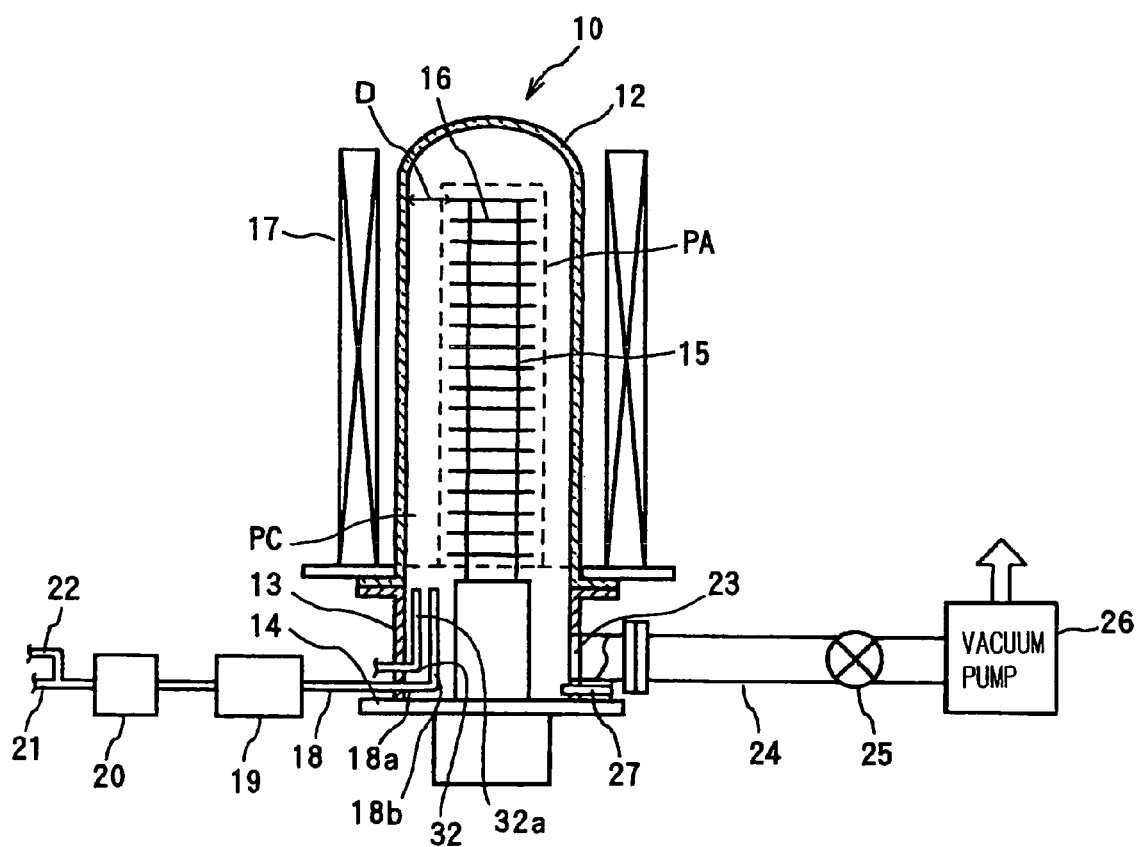
F I G. 1

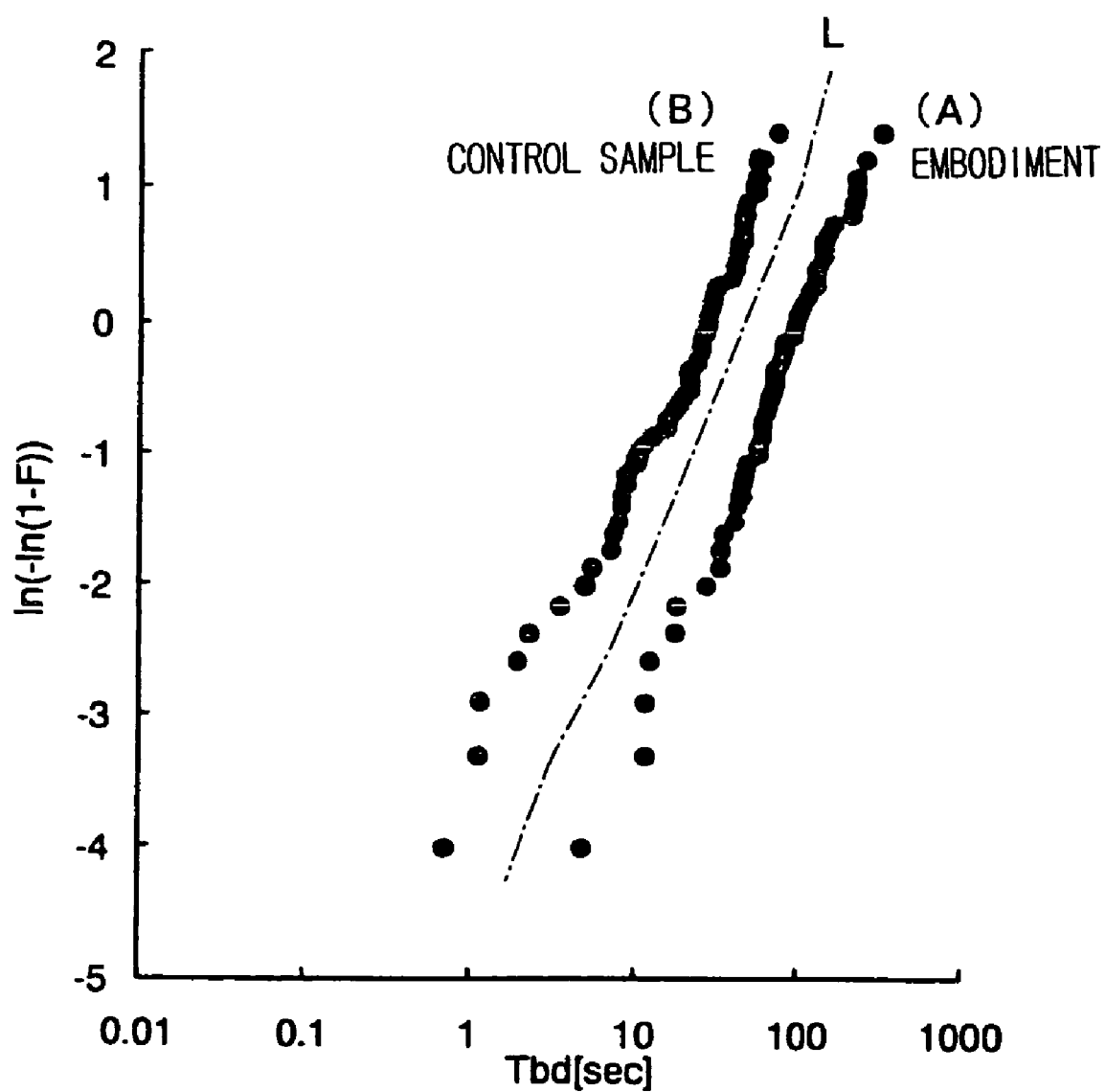
F I G. 5

OXIDE FILM FORMING METHOD

TECHNICAL FIELD

The present invention relates to a method for forming an oxide film on the surface of a wafer composed of silicon for example.

BACKGROUND ART

In manufacturing of semiconductor devices, various kinds of processing are done on semiconductor wafers consisting of silicon or the like, and the processing includes oxidization processing to form an oxide film on the surface of the wafer. The formed oxide film functions as a gate-insulating film of transistor chip, for example. The gate-insulating films are needed in recent years to be thin in film thickness together with long-running high reliability.

Generally, the oxide film formation on a wafer is processed by placing a wafer inside a reaction vessel heated to a high temperature, e.g. 750 to 1100° C., in the presence of oxygen under the conditions of normal or reduced pressure. And the oxide film formation method under depressurized conditions particularly has an advantage that the generating rate of oxide film is small due to the low oxygen concentration whereby the more degrees of freedom for controlling the formation of oxide film is easy even if thin film thickness is formed.

However, in such an oxide film formation process in a low oxygen atmosphere at a high temperature, the problem is that the oxide films obtained in the oxide film formation process turn out to have low reliability due to roughness formed on the surface of the wafer by being etched or nitriding by the nitrogen gas for generating the atmosphere of low oxygen concentration during the time period from loading of the wafer into the reaction vessel to the initiation of actual oxide film formation, i.e. during the heating process to raise the temperature of the reaction vessel or the surface of the wafer to a predetermined temperature for oxidation treatment.

In particular, it is difficult to form high-quality oxide films with high uniformity of the film thickness and film quality over the entire area of larger-diameter wafers which are common now.

Given such situations, the following methods are employed to form high-quality oxide films while averting the problems caused by the oxide film formation process in a low oxygen atmosphere at a high temperature.

(1) A method of forming an initial oxide film on the surface of a wafer as a protective oxide film by maintaining the oxidation atmosphere even in the heating process when carrying out the oxide film formation process at normal pressure.

In this method, improved uniformity of an oxide film can be obtained in the oxide film formation process because the protective oxide film is formed on a wafer under somewhat controlled condition in the heating process.

(2) A method of forming a protective oxide film in advance on the surface of a wafer by chemical treatments such as a wet cleaning with hydrogen peroxide solution etc. for preventing oxide films to have low reliability because of the low oxygen atmosphere at a high temperature when carrying out the oxide film formation process at normal pressure.

In this method, degradation of reliability of the oxide film formed in the oxide film formation process becomes controllable because the protective oxide film is formed under controlled conditions. This method is advantageous when raising temperature in a low oxygen atmosphere in order to prevent the film thickness of a protective oxide film from being thick.

(3) A method of forming a protective oxide film with controlled film thickness by controlling the partial pressure of oxygen inside a reaction vessel in the heating process when carrying out the oxide film formation process at reduced pressure.

(4) A method of forming a protective oxide film with controlled film thickness by controlling the partial pressure of oxygen in the heating process by dilution with an inert gas as such as a nitrogen gas when carrying out the oxide film formation process at normal pressure.

However, the above methods have the following problems:

(1) In the method of positively forming a protective oxide film by performing the heating process in the oxidation atmosphere, anticipating the film thickness of the protective oxide film formed in the heating process, which is necessary to accomplish the process of the oxide film formation, is quite difficult since the film thickness of the protective oxide film is difficult to be controlled. For instance, in a case that an ultrathin oxide film with the final film thickness of 2 nm or less needs to be formed in particular, the operating condition would have much less variation in the oxide film formation process.

Although the protective oxide film formed in this way is generally considered to have a poor film quality, the protective oxide film may be reformed in the process of oxide film formation in many cases. However, in a case that an oxide film with the final film thickness of 2 nm or less is formed in particular, forming an oxide film with high film quality would turn out to be difficult due to the difficulty of reforming the protective oxide film sufficiently in the oxide film formation process because the protective oxide film occupies a large portion of the oxide film finally obtained.

Furthermore, in general, a protective oxide film is formed inside a reaction vessel or on the surface of a wafer where the temperature distribution is uneven, therefore, the oxide film finally formed would turn out to provide quite poor uniformity in film thickness since the film thickness distribution of the protective oxide film formed on the surface of a wafer would show a significant nonuniformity corresponding to a nonuniformity of the temperature of the surface of the wafer.

(2) In the method of forming a protective oxide film using chemical means by a wet cleaning, a slight amount of metallic elements would inevitably be introduced into the chemically formed protective oxide film in the process of the wet cleaning, which fact is the cause of low reliability of the oxide film finally formed.

This method also have a problem that organic contaminants are likely to adhere to the surface of a wafer since the wafer has an occasion to be exposed to atmospheric air before the wafer is brought into a reaction vessel after the protective oxide film is formed by a wet cleaning. Although, in some cases, the organic matters adhered to the surface of the wafer can be removed during combustion by executing the heating process in an oxidation atmosphere, uniformity and control of the film thickness of the oxide film finally formed would significantly be degraded and thus the method is not preferable.

Moreover, the protective oxide film formed using chemical means by a wet cleaning has low reliability in uniformity in film thickness within the entire surface of a wafer, in controllability of film thickness and in film quality, and the oxide film finally formed would have low reliability as a result.

(3) The method of forming a protective oxide film in the heating process at reduced pressure is implemented while the partial pressure of oxygen is being lowered, and the protective oxide film itself can be thinner compared to methods implemented at normal pressure. However, although greater degree of freedom can be obtained to control the final film thickness, the problem is that the entire film thickness would be nonuniform since nonuniformity of the wafer surface temperature affects on thickness distribution of the protective oxide film which is formed in the heating period.

(4) In the method of forming a protective oxide film with controlled film thickness by controlling the partial pressure of oxygen in the heating process with a nitrogen gas, forming a high-quality oxide film is difficult as stated previously due to a wafer inevitably nitrided.

As stated above, the problem is that a high-quality oxide film cannot be formed with advantage on a wafer by the conventional oxide film formation methods.

The present invention suits to solve the problems stated above, and the purpose of the present invention is to provide an oxide film formation method to form with advantage a high-quality oxide film having excellent uniformity in film thickness and film quality over the entire wafer.

The present invention has been completed based on the knowledge obtained by locating the root cause of the low reliability of an oxide film formed in the oxide film formation process, and the root cause is that a stable protective oxide film cannot be formed under conditions with sufficient control before starting the process of oxide film formation by the conventional oxide film formation methods.

DISCLOSURE OF INVENTION

The oxide film formation method of the present invention is characterized by comprising: a pretreatment process of forming a protective oxide film on the surface of a wafer positioned in a reaction vessel, the process being performed by oxidation treatment with radical oxidative species under depressurized conditions or by oxidation treatment with an atmosphere containing radical oxidative species under depressurized conditions and a oxide film formation process to form an oxide film on the surface of said wafer with the protective oxide film obtained by the pretreatment process, the process being performed by oxidation treatment at a predetermined temperature under depressurized conditions.

In the above-mentioned method for the formation of oxide films, the oxide film formation process is preferably performed following the pretreatment process in a continuous manner in said reaction vessel in which said pretreatment process is performed.

The pretreatment process is preferably performed at a temperature lower than the temperature for the oxide-film-formation process, and also is preferably performed under depressurized conditions, the level of the depressurization being higher than the level for the oxide film formation process.

The oxidation treatment in the pretreatment process is preferably performed under the conditions that the temperature is from 25 to 600° C. and the pressure is from 13.3 to 101080 Pa (0.1 to 760 Torr).

The radical oxidative species used for the oxidation treatment in the pretreatment process are preferably produced by ozone or composed of O* (oxygen radical species) and OH* (hydroxyl radical species).

Also, the wafer heating operation in the pretreatment process preceded to the oxide film formation process is preferably performed at a temperature from 750 to 1100° C. in an atmosphere with a partial pressure of oxygen of 1000 Pa or less.

Moreover, the pressure is preferably controlled to be from 13.3 to 101080 Pa (0.1 to 760 Torr) and the partial pressure of oxygen is preferably controlled to be 1000 Pa or less in the pretreatment process.

Furthermore, the oxidation treatment in the oxide film formation process can be performed by the means selected from a wet oxidation method, a dry oxidation method, an internal combustion method, an oxidation method with radical oxidative species and an oxidation method with an atmosphere containing hydrogen chloride, under the conditions that the pressure is from 133 to 101080 Pa (1 to 760 Torr) and the temperature is from 750 to 1100° C.

A gate-insulating film of transistor chip of the present invention is characterized in that the film is formed according to the above-mentioned oxide film formation method.

Also, the method for forming gate-insulating films of transistor chips is characterized by performing the above-mentioned oxide film formation method.

According to the oxide film formation method of the present invention, a high-quality oxide film having excellent uniformity in film thickness and film quality over the entire surface of a wafer can be formed in the oxide film formation process since a protective oxide film is formed on the surface of the wafer positioned inside a reaction vessel by performing oxidation treatment with radical oxidative species (including oxidation treatment with an atmosphere containing radical oxidative species) under depressurized conditions.

This is because the formed protective oxide film is an oxide film having sufficient uniformity in film thickness with high film quality to guarantee the beneficial effects that a spontaneous oxidation of a wafer in uncontrolled state before the initiation of the oxide film formation process can be effectively prevented, and as a result, a quality oxide film with high uniformity as a whole can be formed completely with advantage even in a case that the film thickness of the entire oxide films is thin.

A predetermined processing can hence be accomplished with rather high efficiency by performing the oxide film formation process following the pretreatment process in a continuous manner in the reaction vessel in which said pretreatment process is performed.

Also, in the pretreatment process, the effects stated above can assuredly be achieved by performing said pretreatment process in a temperature lower than the temperature for the oxide film formation process or under depressurized conditions, the level of the depressurization being higher than the level for the oxide film formation process.

In the pretreatment process, the above-mentioned effects can assuredly be achieved by performing the oxidation treatment under the conditions that the pressure is 13.3 to 101080 Pa (0.1 to 760 Torr) and the temperature is 25 to 600° C., and by the radical oxidative species produced by ozone or composed of O* (oxygen radical species) and OH* (hydroxyl radical species), said radical oxidative species being used for the oxidation treatment particularly in the pretreatment process.

Moreover, the effects stated above can assuredly be achieved by performing the wafer heating operation preceded to the oxide film formation process at a temperature from 750 to 1100° C. in an atmosphere with a partial pressure of oxygen of 1000 Pa or less in the pretreatment process.

Furthermore, the effects stated above can assuredly be achieved by controlling the pressure to be 13.3 to 101080 Pa (0.1 to 760 Torr) and the partial pressure of oxygen to be 1000 Pa or less in the pretreatment process.

Desired effects can be achieved by the oxidation treatment in the oxide film formation process by any method among a wet oxidation method, a dry oxidation method, an internal combustion method, an oxidation method with an atmosphere containing radical oxidative species and an oxidation method with an atmosphere containing hydrogen chloride, under the conditions that the pressure is from 133 to 101080 Pa (1 to 760 Torr) and the temperature is from 750 to 1100° C.

In addition, by forming a gate-insulating film of a transistor chip in particular according to the above oxide film formation method, a gate-insulating film with favorable characteristics and long life can be obtained.

BRIEF DESCRIPTION OF DRAWINGS

FIG. 1 is explanatory drawings showing the configuration of an example of a batch-operating vertical apparatus for oxidation treatment employed in the oxide film formation method according to the present invention.

FIG. 5 is a graph showing the Weibull plot of constant voltage TDDB according to the embodiment of the present invention along with the outcome of a control sample.

BEST MODE FOR CARRYING OUT THE INVENTION

Figure 2:
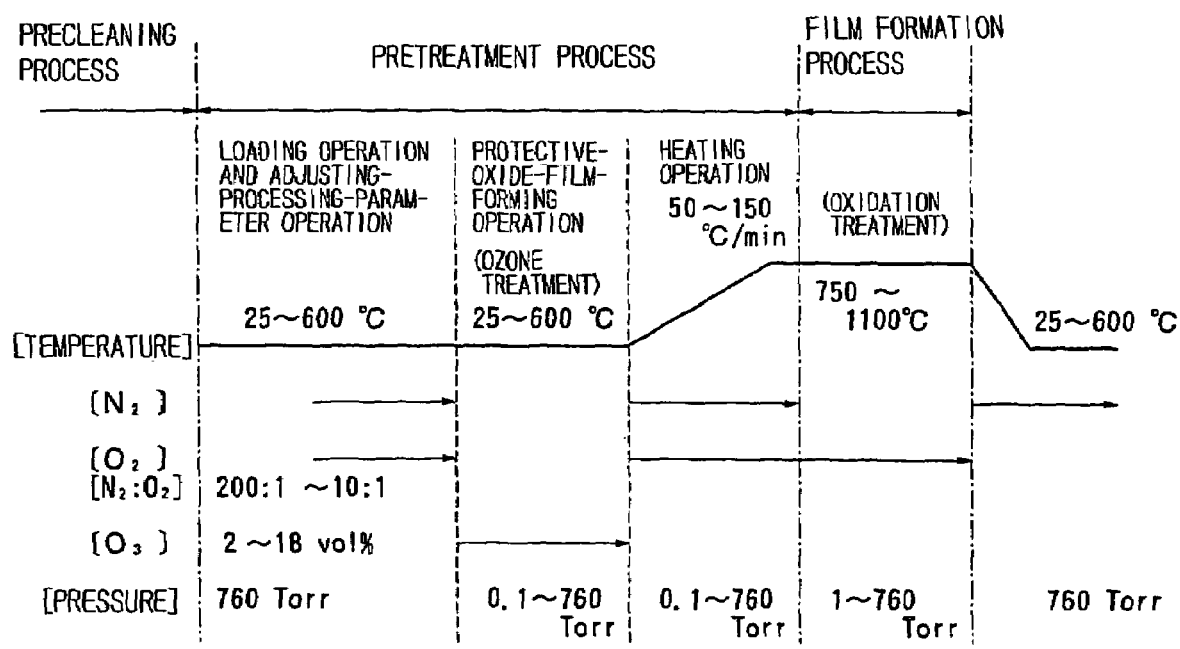
FIG. 2 is a sequence diagram schematically showing a specific process of the oxide film formation method according to the present invention.

Hereinafter, the present invention will be explained in detail with reference to the drawings.

FIG. 1 is explanatory drawings showing the configuration of an example of a batch-operating vertical apparatus for oxidation treatment employed in the oxide film formation method according to the present invention.

The oxidation treatment apparatus 10 comprises a reaction vessel 12 which is cylindrical and vertically extended, has a single tubular structure closed at the top thereof and is composed of silicon dioxide or the likes.

Below the reaction vessel 12, a manifold 13 is positioned which is a cylindrical stainless steel and tightly joined to the lower end of said reaction vessel 12. Below the manifold 13, a cover member 14 is positioned which can be shifted up and down by a boat elevator (not shown).

In this way by lifting the cover member 14 to close the opening of the lower end of the manifold 13, a sealed reaction process chamber PC is formed inside the reaction vessel 12.

On the cover member 14A, a wafer boat 15 which is composed of silicon dioxide for example is mounted. A plurality of the semiconductor wafers 16 consists of silicon for example, on each of which oxide film is to be formed, are held at regular intervals in a vertical direction on the wafer boat 15. By lifting the cover member 14 with the boat elevator to insert the wafer boat 15 into the reaction vessel 12, the wafers 16 held on said wafer boat 15 are positioned in a processing area PA inside the reaction vessel 12.

The reaction vessel 12 is about the size that a cylindrical space D is to be defined between the inner surface of the reaction vessel 12 and the wafer boat 15 or the outer circumferential rim of the wafer 16 after the wafer boat 15 is inserted into the reaction vessel 12. This cylindrical space D is configured to have a size of approximately 20 to 50 mm for example to obtain desired exhaust conductance within said reaction vessel 12 considering after-mentioned gas flow rate and pressure inside the reaction vessel 12.

A warm-up heater 17 comprising a resistance heating element is provided around the reaction vessel 12 to encircle said reaction vessel 12, and this warm-up heater 17 applies heat for the temperature inside the reaction vessel 12 or the temperature of the positioned wafer 16 to reach a predetermined preset temperature.

Meanwhile, in the manifold 13, a processing gas supply pipe 18 is provided piercing through the peripheral wall of said manifold 13. As a pipe material of this processing gas supply pipe 18, Teflon is used for its resistance to corrosion. An end portion 18a of this processing gas supply pipe 18 which is positioned inside the manifold 13 includes a processing gas induction part 18b which is bended and extended upward, and the opening at the end of the processing gas induction part 18b is positioned to face upward at the lower end of the cylindrical space D of the reaction vessel 12.

As a result, through this processing gas induction part 18b, a processing gas is basically supplied upward toward the cylindrical space D and then, by diffusion upon reaching the upper end (ceiling) of the reaction vessel 12 for example, supplied to the processing area PA where the wafer 16 is positioned.

Connected to the processing gas supply pipe 18 is an ozone generator 19. The ozone generator 19 in this example is equipped with a plasma generator for example and forms ozone from oxygen. Connected to the ozone generator 19 in this example is a purifier 20 to which an oxygen gas supply pipe 21 and an additive gas supply pipe 22 are connected.

With the purifier 20, the oxygen gas from the oxygen gas supply pipe 21 and the additive gas, in the form of a nitrogen gas or a carbon dioxide gas, from the additive gas supply pipe 22 have suitable conditions for forming ozone in terms of purity. To be more precise, gases are supplied to the ozone generator 19 in the conditions which are satisfied in reducing the production of impurities, a corrosive gas by moisture in particular.

Also, a vent 23 is provided on the manifold 13 at the opposite side of where the processing gas supply pipe 18 pierces through, and an exhaust pipe 24 is connected to the vent 23, and a vacuum pump 26 is connected to the exhaust pipe 24 with a combination valve 25 inserted therebetween.

The vacuum pump 26 exhausts the reaction vessel 12 of gas through the exhaust pipe 24 and keeps the reaction vessel 12 depressurized inside, and the combination valve 25 functions by adjusting the opening thereof to control the pressure inside the reaction vessel 12.

A nitrogen gas supply pipe 27 is connected to the manifold 13 in the lower position of the vent 23 to supply a nitrogen gas for example.

Moreover, a second processing gas supply pipe 32 is provided in the manifold 13. In the same manner as the processing gas supply pipe 18, the second processing gas supply pipe 32 may have an end portion 32a which is bended an extended upward, and the opening of the end is positioned to face upward at the lower end of the cylindrical space D of the reaction vessel 12 along with the processing gas induction part 18b.

The second processing gas supply pipe 32 supplies processing gases as necessary for various kinds of processing and is used as an oxygen gas supply pipe, for example.

In addition, a control mechanism (not shown) is provided to control the operating conditions of each of the above-mentioned ozone generator 19, purifier 20, oxygen gas supply pipe 21, additive gas supply pipe 22, combination valve 25, vacuum pump 26, nitrogen gas supply pipe 27, second processing gas supply pipe 32, etc. To be more precise, this control mechanism is equipped with a microprocessor, a process controller, etc. and functions to measure the parameters of the processing condition of the oxidation treatment apparatus 10 such as the temperature and pressure of each section and send control signals to each section accordingly based on the measurement data.

According to the present invention, an oxide film is formed on the surface of a wafer by processing the wafer as described below with the oxidation treatment apparatus 10 having the above-mentioned structure.

FIG. 2 is a sequence diagram schematically showing a specific process of the method for the formation of oxide films according to the present invention. As shown in this diagram, the method for the formation of oxide films according to the present invention has three steps consisting of a precleaning process as the first step, a pretreatment process from loading down to the third step as the second step, and an oxide film formation step (hereinafter referred to as a "film formation process") as the third step.

[Precleaning Process]

This precleaning process is a process of cleaning the surface of the wafer on which an oxide film is to be formed. To be precise, the surface of the wafer is cleaned by being immersed in a hydrofluoric acid solution of low concentration, for example, to mainly remove the oxides formed on the surface of the wafer.

Although the specific parameters in this precleaning process are not necessarily limited, the temperature may be 23° C. and the concentration of the chemical liquid may be 1 vol. % in the process, for example.

Other cleaning means or a combination of proper cleaning means can be employed instead in the precleaning process.

[Pretreatment Process]

The pretreatment process has 4 steps including:
(1) a loading operation in which a wafer is loaded to be positioned in the reaction vessel of the oxidation treatment apparatus;
(2) an adjusting-processing-parameter operation to maintain inside the reaction vessel at the predetermined pressure and temperature;
(3) a protective-oxide-film-forming operation; and
(4) a heating operation.

(1) Loading Operation

In the loading operation, the subject wafer is loaded into the reaction vessel of the oxidation treatment apparatus and positioned in the processing area PA.

In more specific terms referring to the oxidation treatment apparatus 10 of FIG. 1, the wafer boat 15 holding the wafer 16 after being cleaned in the precleaning process is mounted on the cover member 14 staying down.

Meanwhile, the temperature inside the reaction process chamber PC is controlled at an established predetermined loading temperature of t1 by heat application with the warm-up heater 17 as necessary. The temperature t1 for loading ranges from 25° C. (a room temperature) to 600° C., for example.

The temperature t1 for loading preferably is within the range from 50 to 550° C. and 200 to 400° C. in particular, depending on the kinds or conditions of the means for forming protective oxide films actually employed.

Under these conditions, the wafer boat 15 is loaded into the reaction vessel 12 by lifting the cover member 14 using the boat elevator, not shown, thereby positioning the wafer 16 in the processing area PA inside the reaction vessel 12 (loading), and at the same instant, the reaction process chamber PC is sealed because the opening of the lower end of the manifold 13 is closed with the cover member 14.

(2) Adjusting-Processing-Parameter Operation

The adjusting-processing-parameter operation is performed following the above-mentioned loading operation to suitably condition inside the reaction process chamber PC for the protective-oxide-film-forming operation.

To be precise, the operation is performed to provide an atmosphere of reduced pressure inside the reaction process chamber PC.

Gas is exhausted from the reaction process chamber PC until the pressure inside the reaction vessel 12 reaches the pressure level of the predetermined reduced pressure, e.g. 13.3 to 26600 Pa (0.1 to 200 Torr), from the normal pressure of 101080 Pa (760 Torr).

Concurrently with the above-mentioned depressurization operation, the temperature inside the reaction process chamber PC is being controlled to have the established predetermined temperature t2 for forming protective oxide films by heat application with the warm-up heater 17 as necessary. In this operation, the targeted value of the temperature inside the reaction process chamber PC is the temperature t2 for forming protective oxide films in the following protective-oxide-film-forming operation.

The above depressurization operation and heating operation are run for the necessary time period, e.g. approximately 10 to 20 minutes, for the state of the predetermined pressure and temperature inside the reaction process chamber PC to be stable so that the condition inside the reaction process chamber PC is stabilized.

(3) Protective-Oxide-Film-Forming Operation

This operation is performed to form a protective oxide film on the surface of a wafer under the conditions that the pressure and temperature inside the reaction process chamber PC is stable as described above.

To be more precise, the supply of a nitrogen gas from the nitrogen gas supply pipe 27 is ceased and an oxygen gas of a predetermined amount is supplied to the purifier 20 from the oxygen gas supply pipe 21 at a flow rate of 1 to 10 slm for example, and concurrently a nitrogen gas of a predetermined amount is supplied to the purifier 20 from the additive gas supply pipe 22 at a flow rate of 0.008 to 0.08 slm for example. Through the purifier 20, the supplied oxygen gas and nitrogen gas have suitable conditions for forming ozone and are supplied to the ozone generator 19.

In the ozone generator 19, ozone gas is produced by plasma, for example, acting on the supplied oxygen gas through a plasma generator. Then, a processing gas containing e.g. 2 to 18 vol. % of ozone is supplied from the ozone generator 19 through the processing gas supply pipe 18 to be blown upward in the cylindrical space D inside the reaction vessel 12 from the processing gas induction part 18b.

The supply flow rate of the processing gas containing ozone shall be satisfying to form a desired protective oxide film on the wafer positioned in the processing area PA and can be established corresponding to different conditions in actuality: to cite instances, within the range approximately from 1 to 10 slm.

Also, for producing radical oxidative species, a method can be employed wherein a hydrogen gas ($H_2$) and an oxygen gas ($O_2$) are supplied directly to the reaction process chamber PC at reduced pressure. In this method, for example, a hydrogen gas and an oxygen gas may be supplied at a ratio of 0.1:99.9 or 99.9:0.1 at a pressure of 13.3 to 133 Pa.

The above processing gas supply is accomplished under the conditions that the temperature inside the reaction process chamber PC is maintained at the temperature t2 for forming protective oxide films and the pressure is controlled as well.

The temperature t2 for forming protective oxide films is within the range or 25° C. (a room temperature) to 600° C. for example, lower than the temperature t3 for forming oxide films in the following process of oxide film formation in general. Although the range depends on the kinds or conditions of the means for forming protective oxide films actually employed, 50 to 550° C. is preferable and 200 to 400° C. in particular is preferable.

This temperature t2 for forming protective oxide films may be the same as or different from the above-mentioned temperature t1 for loading, but preferably the temperature t2 for forming protective oxide films is the same as the temperature t1 for loading in actuality because, in this case, problems accompanied with change of temperature conditions such as causing defects in the formed protective oxide films for example can be averted and also the protective-oxide-film-forming operation can be started with high time efficiency as the established temperature inside the reaction process chamber PC is not changed.

During the protective-oxide-film-forming operation, the pressure inside the reaction process chamber PC is maintained under depressurized conditions, e.g. 13.3 to 101080 Pa (0.1 to 760 Torr).

Furthermore, this protective-oxide-film-forming operation is performed within a controlled time frame. To be more precise, the processing gas is supplied into the reaction process chamber PC only for a controlled time period. This protective-oxide-film-forming operation time is set for 1 to 130 minutes, for example.

In the above-mentioned protective-oxide-film-forming operation, oxygen atom radicals as radical oxidative species are produced due to the activated ozone inside the reaction process chamber PC as ozone is contained in the supplied processing gas, and since the oxygen atom radicals make contact with the wafer 16, the organic matters on the surface of said wafer 16 are removed and also a protective oxide film is formed on the surface of said wafer 16.

Therefore, in this protective-oxide-film-forming operation, the film thickness of the formed protective oxide film will be thin with dense texture and also uniform since the temperature inside the reaction process chamber PC is maintained at the predetermined temperature t2 for forming protective oxide films and the pressure is maintained under the predetermined depressurized conditions.

The film thickness of formed protective oxide films is 0.1 to 5 nm for example, preferably 0.5 to 2 nm in particular.

In the shown oxidation treatment apparatus 10, the reaction vessel 12 has a single tubular structure in a state that the cylindrical space D is defined between the inner peripheral wall of the reaction vessel 12 and the outer circumferential rim of the wafer 16 so that preferable exhaust conductance can be obtained which enables to maintain the activated state of ozone stable and also maintain inside said reaction process chamber PC under the predetermined depressurized conditions. Furthermore, the preferable fact in improving the conductance inside the reaction process chamber PC is that the processing gas supply pipe 18 has at its end portion the processing gas induction part 18b bended and extended upward and also the vent 23 is positioned at the opposite side of the processing gas supply pipe 18.

Moreover, a processing gas can evenly be supplied to the wafer 16 in the processing area PA by supplying the processing gas upward toward the cylindrical space D encircling the outer circumference of the processing area PA in which the wafer 16 is positioned. This is because the flow velocity of the processing gas is reduced in the processing area PA and therefore has hardly any impact caused by the flow velocity distribution at the blow into the reaction process chamber PC.

In the above-mentioned ozone generator 19, high ozone production efficiency can be obtained by supplying a nitrogen gas as well as an oxygen gas. Moreover, although a processing gas will contain nitrogen oxides (NOx) due to the nitrogen gas supply, contamination inside the reaction process chamber PC due to corrosion of the processing gas supply pipe 18 can be avoided by using Teflon pipe material for the processing gas supply pipe 18 to obtain high resistance to corrosion against the contained nitrogen oxides.

(4) Heating Operation Inside the Reaction Vessel

The heating operation is performed on the wafer 16, on which a protective oxide film is formed by the above protective-oxide-film-forming operation, to allow for transfer to the film formation process which is an original purpose.

This heating operation may be proceeded to the competent condition for the intended film formation process to be initiated.

Basically, heat is applied in this heating operation for inside the reaction process chamber PC to reach the level of the required atmospheric condition for the film formation process, i.e. to reach the preset temperature for the film formation process. The examples of the heating rate inside the reaction process chamber PC is not specifically limited but within the range from 20 to 200° C./min., preferably 50 to 150° C.

The pressure inside the reaction process chamber PC is controlled corresponding to the preset pressure in the film formation process. To be more precise, the pressure is controlled to within 13.3 to 101080 Pa (0.1 to 760 Torr) and the partial pressure of oxygen is controlled to equal to or less than 1000 Pa for example, under the condition that supply of the processing gas containing ozone is ceased and an oxygen gas or an oxygen gas and a nitrogen gas are supplied through the second processing gas supply pipe 32 at a controlled flow rate.

In this heating process, although the temperature of a wafer inside the reaction process chamber PC is gradually raised, the wafer is protected by the protective oxide film formed on the surface of each wafer, thereby proceeding without control of oxidization of wafers can effectively be prevented.

By performing the above 4-step operations of (1) loading operation, (2) adjusting-processing-parameter operation, (3) protective-oxide-film-forming operation and (4) heating operation, a protective oxide film is formed on the surface of a wafer inside the reaction process chamber PC under controlled conditions which the film formation process can directly follow.

[Film Formation Process]

The film formation process is a primary process for the purpose of forming the intended oxide films on the above wafers.

According to the present invention, this film formation process is performed by providing an oxidation treatment wherein the temperature of a wafer is raised under depressurized conditions in the atmosphere inside the reaction process chamber PC with oxygen.

Available means for the oxidation treatment are not specifically limited, and the known conventional means for forming oxide films can be employed without modification. The means to be employed can be selected from or in combination of, for example, a wet oxidation method using water vapor, a dry oxidation method using ozone or other gases containing oxygen, an internal combustion method using a oxidizing gas obtained by combustion of proper gas inside the reaction process chamber, an oxidation method with radical oxidative species and an oxidation method with the atmosphere containing hydrogen chloride.

In this film formation process, the pressure inside the reaction process chamber may be within 133 to 101080 Pa (1 to 760 Torr) depending on the employed oxidation treatment means, and the temperature is generally set at the range from 750 to 1100° C.

An oxide film is formed on the surface (on the continued area of a protective oxide film, to be exact) of a wafer through this film formation process, and this oxide film offers quite high quality by being formed in the film formation process for the wafer on which a protective oxide film is formed under the above-mentioned particular conditions, and further offers high uniformity in film thickness and film quality over the entire wafer even in a case of a thin film with film thickness of 5 nm for example.

Since an oxide film with dense texture and still high uniformity over the entire wafer despite the thinness in film thickness can be formed in this fashion according to the above-mentioned method, the present method for the formation of oxide films is effective as a method for forming gate-insulating films composing transistor chips, and said gate-insulating films will have favorable characteristics and long life.

Moreover, by the heating operation performed as the final operation in the pretreatment process, the film formation process is allowed to be run in a state with a wafer still positioned inside the reaction process chamber PC after completion of the pretreatment process, i.e. without removing the wafer out. Therefore, the protective-oxide-film-forming operation is so-called an in-situ operation (in-situ: continuous processing with the same apparatus) from the viewpoint with a focus on the film formation process. Performing the film formation process following the pretreatment process in a continuous manner in the same reaction process chamber PC in this way is highly advantageous because oxide films are quite efficiently formed and wafers are not contaminated.

The film formation process is preferably performed by a dry oxidation method since the protective-oxide-film-forming operation is performed with the processing gas containing ozone. In this case, many of the facilities can be shared in the protective-oxide-film-forming operation and the film formation process.

Although the conditions in the case of performing the film formation process by a dry oxidation method are not specifically limited, the processing may be performed for 1 to 300 minutes under the conditions that the temperature is 750 to 110020 C. and the pressure is 133 to 101080 Pa (1 to 760 Torr), for example.

When the film formation process is completed, the pressure returns to normal and the temperature is lowered to 25 to 600° C. inside the reaction process chamber PC by supplying a predetermined amount of nitrogen gas, e.g. for approximately 15 minutes at a flow rate of 20 slm, through the nitrogen gas supply pipe 27. After that, the cover member 14 is brought down by actuating the boat elevator, and thus unloading is performed in the form the wafer boat 15 ejected from the reaction process chamber PC.

Hereinbefore described is the method for the formation of oxide films according to the present invention, and the oxidation treatment apparatus employed for realizing the present invention is not specifically limited.

Although the case of employing the batch-operating vertical apparatus for oxidation treatment structured as shown in FIG. 1 is described above for example, the present invention can be realized with an oxidation treatment apparatus for single wafer processing, for example. Also, the structure of-the reaction vessel etc. constructing the reaction process chamber is limitless, and for example a double-pipe structure comprising an inner pipe and an outer pipe may be employed.

EMBODIMENT

The embodiment of the present invention will be described below although the present invention is not limited thereto.

Figure 3:
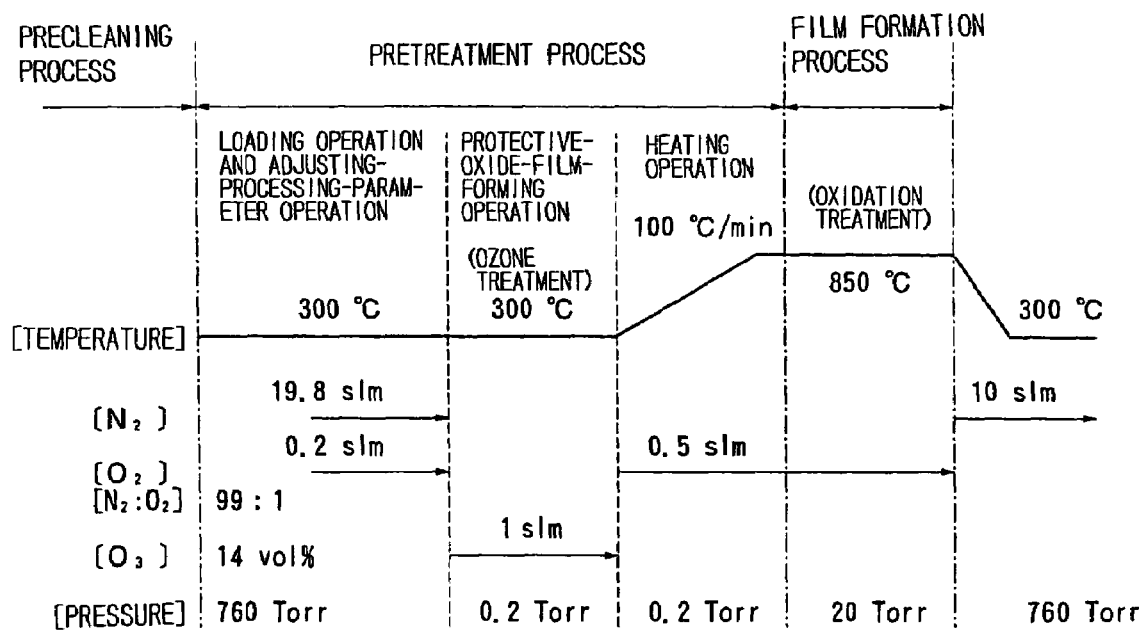
FIG. 3 is a sequence diagram showing a process of an embodiment of the oxide film formation method according to the present invention.

Each of the following process was performed basically with the oxidation treatment apparatus with the structure shown in FIG. 1 and according to the sequence shown in FIG. 3.

[Precleaning Process]

The precleaning process was performed in a hydrofluoric acid solution of 1 vol % concentration at a temperature of 23° C. by over-etching by 30% of the sacrificial oxide film of a silicon wafer with diameter of 8 inches.

[Pretreatment Process]

(1) Loading operation

The 100 pieces of wafers obtained by the precleaning process were held on the wafer boat 15 made of silicon dioxide which was then mounted on the cover member 14, and while the temperature was controlled at 300° C. and the pressure at 101080 Pa (760 Torr) inside the reaction process chamber PC with a nitrogen gas at a flow rate of 19.8 slm and an oxygen gas at a rate of 0.2 slm being supplied to the reaction process chamber PC, said cover member 14 was inserted into the reaction vessel 12 at a room temperature to position wafers 16 in the processing area PA.

(2) Adjusting-Processing-Parameter Operation The pressure inside the reaction process chamber PC was reduced to 13.3 Pa or less by a depressurization operation, and the temperature inside the reaction process chamber PC was maintained at 300° C. as the preset temperature for forming protective oxide films t2 by controlling the warm-up heater 17.

(3) Protective-Oxide-Film-Forming Operation

Then, as supply of a nitrogen gas from the nitrogen gas supply pipe 27 was ceased, the processing gas containing ozone at a concentration of 14 volume percent was obtained from the ozone generator 19 by supplying an oxygen gas from the oxygen gas supply pipe 21 at a rate of 1 slm and supplying a nitrogen gas from the additive gas supply pipe 22 at a rate of 0.008 slm to the purifier 20, and this processing gas containing ozone was supplied into the reaction process chamber PC maintained at a temperature of 300° C. and at a pressure of 26.6 Pa (0.2 Torr) at a rate of 1 slm. This operation was continued for 9 minutes.

The analysis performed afterward confirmed that a protective oxide film with film thickness of 1 nm had been formed on each wafer 16 by this protective-oxide-film-forming operation.

(4) Heating Operation Inside the Reaction Vessel

Following the above adjusting-processing-parameter operation, the heating operation was performed in a state that the wafers 16 were still positioned inside the reaction vessel 12.

To be more precise, the temperature inside the reaction process chamber PC was raised to 850° C. by actuating the warm-up heater 17 at a heating rate of 100° C./min while supply of the processing gas containing ozone was ceased and an oxygen gas was supplied from the second processing gas supply pipe 32 at a rate of 0.5 slm.

[Film Formation Process]

Then, the film formation process was performed for 20 minutes under the conditions that the temperature was 850° C. and the partial pressure of oxygen was 2660 Pa (20 Torr pressure) with the oxygen gas supply from the second processing gas supply pipe 32 maintained at the rate of 0.5 slm.

After that, the pressure was returned to normal and the temperature was lowered to 300° C. inside the reaction process chamber PC by supplying a nitrogen gas from the nitrogen gas supply pipe 27 at a rate of 20 slm for 15 minutes, and then the wafer boat 15 was ejected from the reaction process chamber PC by bringing the cover member 14 down by actuating the boat elevator. Thus wafers on which oxide films with the respective total film thickness of 2.7 nm were manufactured.

Figure 4:
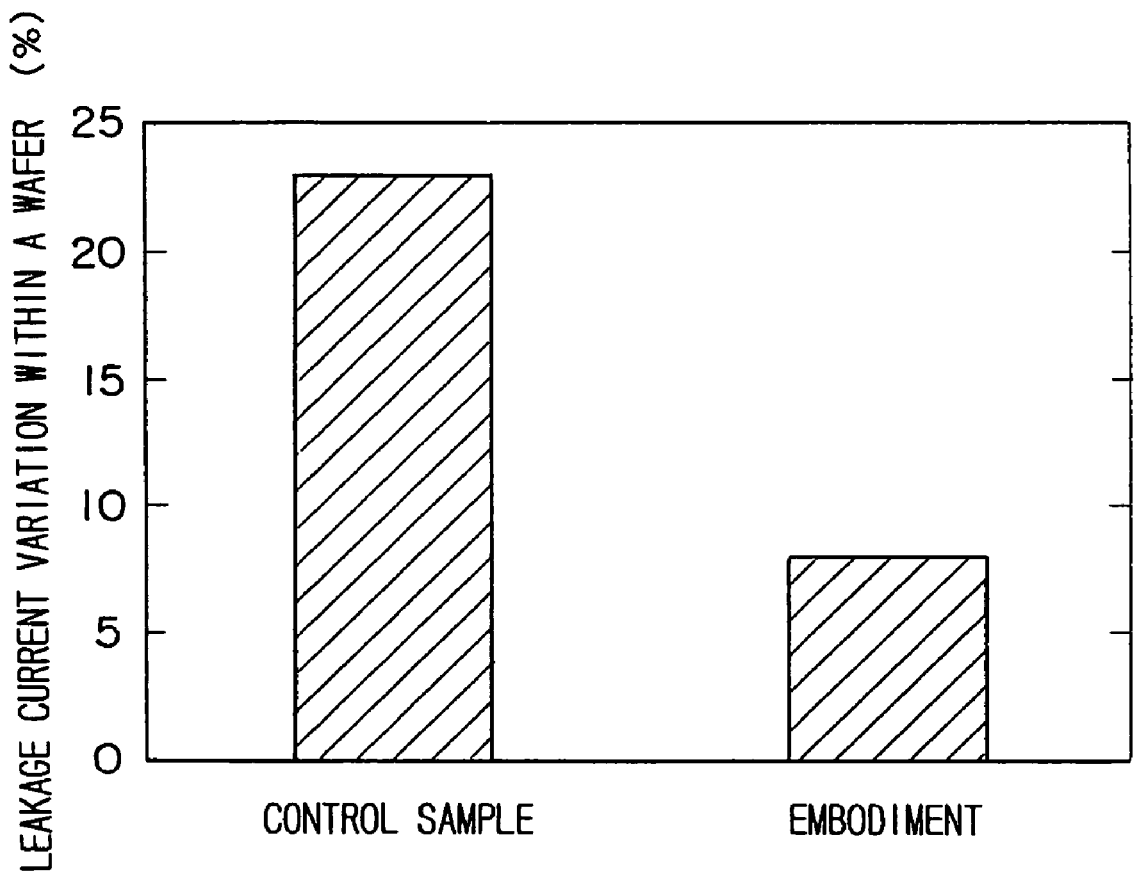
FIG. 4 is a graph showing the outcome of variation in the leakage current of the oxide film according to the embodiment of the present invention along with the outcome of a control sample.

The characteristics of the oxide films obtained in the above way were examined with an NMOS capacitor prepared. That is to say, the range of the leakage current variation at an electric field intensity of −3 MV/cm within the wafer was examined on each oxide film of the total of 112 chip sections formed on one wafer to find out that the range was within 8% on the basis of the mean value, as shown in FIG. 4.

On the other hand, a protective oxide film with a mean thickness of 0.8 nm was formed on a silicon wafer from the same lot by immersion in a hydrochloric acid solution at 60° C. for 10 minutes, the ratio of $H_2O_2:HCl:H_2O$ of the solution being 1:1:5. Then an oxide film was formed on this wafer to prepare a control sample by running the process of oxide film formation (film formation process) by a dry oxidation method under exactly the same conditions as the above embodiment except for the protective-oxide-film-forming operation, and the leakage current variation within the wafer was examined likewise to obtain the result of 23% as shown in FIG. 4.

Based on the results stated above, the formed oxide film can obviously have high uniformity in film thickness and film quality over the entire wafer according to the method for the formation of oxide films of the above-mentioned embodiment.

Also, reliability of the formed oxide films of the wafer obtained in the above embodiment and the control sample were evaluated by the constant voltage TDDB testing. FIG. 5 shows the results.

FIG. 5 illustrates the Weibull plot of TDDB data in which the plot group (A) shows the results of the above-mentioned embodiment and the plot group (B) shows the results of the above-mentioned control sample. The L is a boundary line between the plot groups (A) and (B).

In this case, the TDDB testing was performed under the conditions that the stress was maintained at −12.5 MV/cm and the chuck temperature was maintained at 120° C., and the capacitor area was $1 \times 10^{-4}$ cm$^2$.

Based on the result shown in FIG. 5, the life as an insulating film in the form of the oxide film of a wafer obtained in the above-mentioned embodiment obviously is longer to a large extent compared to the film in the form of the control sample.

In a case that the oxide films formed according to the method for the formation of oxide films of the present invention are used as gate-insulating films composing transistor chips for example, it is to be recognized that the transistor chips maintain the performance for extended period of time and attain high reliability.

As stated above, the quality oxide film with high uniformity in film thickness and film quality over the entire area can be formed on the surface of a wafer with advantage according to the method for the formation of oxide films of the present invention.

The invention claimed is:

1. An oxide film formation method to form an oxide film on a surface of a wafer, the method comprising:
    a pretreatment process of forming a protective oxide film on the surface of the wafer positioned in a reaction vessel, the pretreatment process being performed by an oxidation treatment with radical oxidative species under depressurized conditions at a first temperature or by an oxidation treatment with an atmosphere containing radical oxidative species under depressurized conditions at the first temperature; and
    an oxide film formation process to form an oxide film on the surface of said wafer with the protective oxide film obtained by the pretreatment process, the oxide film formation process being performed by an oxidation treatment at a second temperature higher than the first temperature under depressurized conditions,
    wherein the pretreatment process is performed under depressurized conditions, and
    a level of depressurization during pretreatment is higher than a level of depressurization for the oxide film formation process.

2. An oxide film formation method to form an oxide film on a surface of a wafer, the method comprising:
    a pretreatment process of forming a protective oxide film on the surface of the wafer positioned in a reaction vessel, the pretreatment process being performed by an oxidation treatment with radical oxidative species under depressurized conditions at a first temperature or by an oxidation treatment with an atmosphere containing radical oxidative species under depressurized conditions at the first temperature; and
    an oxide film formation process to form an oxide film on the surface of said wafer with the protective oxide film obtained by the pretreatment process, the oxide film formation process being performed by an oxidation treatment at a second temperature higher than the first temperature under depressurized conditions, wherein the radical oxidative species are composed of O* (oxygen radical species) and OH* (hydroxyl radical species).

3. An oxide film formation method according to claim 1 or 2, wherein the oxide film formation process is performed following the pretreatment process in a continuous manner in said reaction vessel in which said pretreatment process is performed.

4. An oxide film formation method according to claim 1 or 2, wherein a wafer heating operation in the pretreatment process preceding the oxide film formation process is performed at a temperature from 750 to 1100° C. in an atmosphere with a partial pressure of oxygen of 1000 Pa or less.

5. An oxide film formation method according to claim 1 or 2, wherein the pressure is controlled to be from 13.3 to 101080 Pa (0.1 to 760 Torr) and a partial pressure of oxygen is controlled to be 1000 Pa or less in the pretreatment process.

6. An oxide film formation method according to claim 1 or 2, wherein the oxidation treatment in the oxide film formation process is performed by one of a wet oxidation method, a dry oxidation method, an internal combustion method, an oxidation method with radical oxidative species and an oxidation method with an atmosphere containing hydrogen chloride, under conditions where the pressure is from 133 to 101080 Pa (1 to 760 Torr) and the temperature is from 750 to 1100° C.

* * * * *